United States Patent
Lee et al.

(10) Patent No.: US 12,527,156 B2
(45) Date of Patent: Jan. 13, 2026

(54) DISPLAY DEVICE WITH DISCONNECTED CHARGE GENERATION REGIONS

(71) Applicant: Samsung Display Co., LTD., Yongin-si (KR)

(72) Inventors: Sang Shin Lee, Yongin-si (KR); Min Young Kim, Hwaseong-si (KR); Yong Hwan Kim, Seoul (KR); Jung Hyun Ahn, Seongnam-si (KR); Seung Jin Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 896 days.

(21) Appl. No.: 17/590,501

(22) Filed: Feb. 1, 2022

(65) Prior Publication Data

US 2023/0030918 A1    Feb. 2, 2023

(30) Foreign Application Priority Data

Jul. 28, 2021  (KR) .................. 10-2021-0099251

(51) Int. Cl.
| | |
|---|---|
| *H01L 51/50* | (2006.01) |
| *H01L 51/56* | (2006.01) |
| *H10K 50/13* | (2023.01) |
| *H10K 50/15* | (2023.01) |
| *H10K 71/00* | (2023.01) |

(52) U.S. Cl.
CPC .......... *H10K 50/15* (2023.02); *H10K 50/131* (2023.02); *H10K 71/00* (2023.02)

(58) Field of Classification Search
CPC .................................................. H10K 50/131
See application file for complete search history.

(56) References Cited

U.S. PATENT DOCUMENTS

| | | | |
|---|---|---|---|
| 9,570,519 B2* | 2/2017 | Lee .................. | H10K 50/19 |
| 2004/0135498 A1* | 7/2004 | Takanosu ............ | H10K 59/35 |
| | | | 313/506 |

(Continued)

FOREIGN PATENT DOCUMENTS

| | | | | |
|---|---|---|---|---|
| JP | 2020161577 A | * | 10/2020 | ............. H10K 59/35 |
| KR | 20150079244 A | | 7/2015 | |

(Continued)

OTHER PUBLICATIONS

Korean Office Action dated Dec. 16, 2024, in Korean Patent Application No. 10-2021-0099251.

*Primary Examiner* — Peter Bradford
(74) *Attorney, Agent, or Firm* — Lerner David LLP

(57) ABSTRACT

A display device includes a first pixel, a second pixel, and a third pixel each of which includes a first electrode on a substrate, a first sub-light emitting portion on the first electrode, a first charge generation layer on the first sub-light emitting portion, a second sub-light emitting portion on the first charge generation layer, and a second electrode on the second sub-light emitting portion. The second sub-light emitting portion includes a hole transport layer on the first charge generation layer and an emission layer on the hole transport layer. The hole transport layer of the first pixel is on the first charge generation layer of the first pixel and completely covers the first charge generation layer of the first pixel. A part of an edge of the hole transport layer of the first pixel overlaps the first charge generation layer of the second pixel.

17 Claims, 13 Drawing Sheets

(56) References Cited

U.S. PATENT DOCUMENTS

| | | | |
|---|---|---|---|
| 2015/0194471 | A1 | 7/2015 | Lee |
| 2019/0326542 | A1* | 10/2019 | Yang ..................... H10K 59/32 |
| 2021/0184148 | A1 | 6/2021 | Kim et al. |
| 2022/0165807 | A1* | 5/2022 | Hamada ................. H10K 59/38 |

FOREIGN PATENT DOCUMENTS

| | | |
|---|---|---|
| KR | 10-2017-0074566 | 6/2017 |
| KR | 20180061948 A | 6/2018 |
| KR | 10-2019-0050460 | 5/2019 |
| KR | 10-2019-0123829 | 11/2019 |
| KR | 10-2020-0037891 | 4/2020 |
| KR | 20210075282 A | 6/2021 |

* cited by examiner

DISPLAY DEVICE WITH DISCONNECTED CHARGE GENERATION REGIONS

CROSS-REFERENCE TO RELATED APPLICATION

This application claims priority to and the benefit of Korean Patent Application No. 10-2021-0099251 under 35 U.S.C. § 119, filed in the Korean Intellectual Property Office on Jul. 28, 2021, the entire contents of which are incorporated herein by reference.

BACKGROUND

(a) Technical Field

The disclosure relates to a display device and a manufacturing method thereof.

(b) Description of the Related Art

A light emitting display device may include two electrodes and an emission layer disposed between the two electrodes. An electron injected from one electrode and a hole injected from another electrode may be combined in an organic emission layer to form an exciton. As the exciton changes from an exited state to a ground state, it can emit energy and emit light.

A display device generally includes multiple pixels each of which includes a light emitting diode (or a self-emissive element). Multiple transistors and at least one capacitor may be formed for driving the light emitting diode in each pixel.

The multiple pixels generally include pixels of different colors (i.e., pixels capable of emitting light of different colors).

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The embodiments of the disclosure show improvements in image quality by preventing leaky emission between neighboring pixels of different colors.

A display device according to an embodiment may include a first pixel, a second pixel, and a third pixel that are adjacent to each other, wherein each of the first pixel, the second pixel, and the third pixel may include a first electrode disposed on a substrate, a first sub-light emitting portion disposed on the first electrode, a first charge generation layer disposed on the first sub-light emitting portion, a second sub-light emitting portion disposed on the first charge generation layer, and a second electrode disposed on the second sub-light emitting portion, the second sub-light emitting portion may include a hole transport layer disposed on the first charge generation layer and an emission layer disposed on the hole transport layer, the hole transport layer of the first pixel may be disposed on the first charge generation layer of the first pixel and may completely cover the first charge generation layer of the first pixel, a part of an edge of the hole transport layer of the first pixel may overlap the first charge generation layer of the second pixel, and the first charge generation layer of the second pixel may be separated from the first charge generation layer of the third pixel.

A top surface of the part of the edge of the hole transport layer of the first pixel may contact the first charge generation layer of the second pixel.

The part of the edge of the hole transport layer of the first pixel may contact a top surface of a layer disposed below the first charge generation layer of the first pixel.

Each of the first pixel, the second pixel, and the third pixel may further include a second charge generation layer disposed below the first charge generation layer.

The second charge generation layer of the first pixel, the second charge generation layer of the second pixel, and the second charge generation layer of the third pixel may be connected to each other and may be continuously formed on the substrate.

The first charge generation layer and the hole transport layer may be aligned with each other in each of the first pixel, the second pixel, and the third pixel.

The first charge generation layer may be a p-type charge generation layer, and the first charge generation layer may include a material included in the hole transport layer, and a p-type dopant.

A display device according to an embodiment may include a first pixel, a second pixel, and a third pixel that are adjacent to each other, wherein each of the first pixel, the second pixel, and the third pixel may include a first electrode disposed on a substrate, a first sub-light emitting portion disposed on the first electrode, a first charge generation layer disposed on the first sub-light emitting portion, a second sub-light emitting portion disposed on the first charge generation layer, and a second electrode disposed on the second sub-light emitting portion, the second sub-light emitting portion may include a hole transport layer disposed on the first charge generation layer and an emission layer disposed on the hole transport layer, a part of an edge of the first charge generation layer of the third pixel may be disposed on the emission layer of the first pixel and may overlap the emission layer of the first pixel, and the first charge generation layer of the third pixel may be separated from the first charge generation layer of the first pixel or the first charge generation layer of the second pixel.

A part of an edge of the first charge generation layer of the second pixel may be disposed on the hole transport layer of the first pixel and may contact the hole transport layer of the first pixel.

A part of an edge of the first charge generation layer of the second pixel may be disposed on the emission layer of the first pixel and may contact the emission layer of the first pixel.

A driving voltage of the third pixel may be higher than a driving voltage of the first pixel or second pixel.

The third pixel may display blue.

The hole transport layer of the first pixel may be disposed on the first charge generation layer of the first pixel and may completely cover the first charge generation layer of the first pixel.

A top surface of the part of the edge of the hole transport layer of the first pixel may contact the first charge generation layer of the second pixel.

The part of the edge of the hole transport layer of the first pixel may contact a top surface of a layer disposed below the first charge generation layer of the first pixel.

Each of the first pixel, the second pixel, and the third pixel may further include a second charge generation layer disposed below the first charge generation layer.

The second charge generation layer of the first pixel, the second charge generation layer of the second pixel, and the second charge generation layer of the third pixel may be connected to each other and may be continuously formed on the substrate.

The first charge generation layer and the hole transport layer may be aligned with each other in each of the first pixel, the second pixel, and the third pixel.

A method for manufacturing a display device according to an embodiment may include forming electrodes of a first pixel, a second pixel, and a third pixel on a substrate; forming sub-light emitting portions of the first pixel, the second pixel, and the third pixel on the electrodes; sequentially forming a charge generation layer of the first pixel, a hole transport layer of the first pixel, and an emission layer of the first pixel on a sub-light emitting portion of the first pixel; and after the forming of the emission layer of the first pixel, sequentially forming a charge generation layer of the third pixel, a hole transport layer of the third pixel, and an emission layer of the third pixel on a sub-light emitting portion of the third pixel.

The method for manufacturing the display device may further include, after the forming of the emission layer of the first pixel and before the forming of the charge generation layer of the third pixel, sequentially forming a charge generation layer of the second pixel, a hole transport layer of the second pixel, and an emission layer of the second pixel on a sub-light emitting portion of the second pixel.

According to the embodiments of the disclosure, image quality can be improved by preventing leaky emission between neighboring pixels of different colors.

DETAILED DESCRIPTION OF THE EMBODIMENTS

Figure 1:
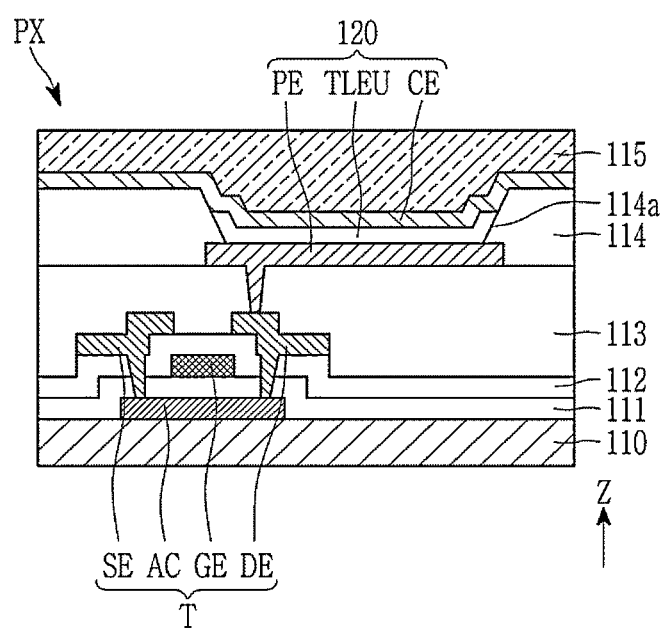
FIG. 1 is a cross-sectional view of a pixel of a display device according to an embodiment.

The disclosure will be described more fully hereinafter with reference to the accompanying drawings, in which embodiments of the disclosure are shown. As those skilled in the art would realize, the described embodiments may be modified in various different ways.

The drawings and description are to be regarded as illustrative in nature and not restrictive. Like reference numerals designate like elements throughout the specification.

In addition, since the size and thickness of each configuration shown in the drawings are arbitrarily indicated for better understanding and ease of description, the disclosure is not necessarily limited to the drawings. In the drawings, the thickness of layers, films, panels, regions, etc., are exaggerated for clarity. In addition, in the drawings, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

In addition, when "connected to" in the entire specification, this does not only mean that two or more constituent elements are directly connected, but also means that two or more constituent elements are indirectly connected, physically connected, and electrically connected through other constituent elements, or being referred to by different names depending on the position or function, while being integral.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

The terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About," "approximately," or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
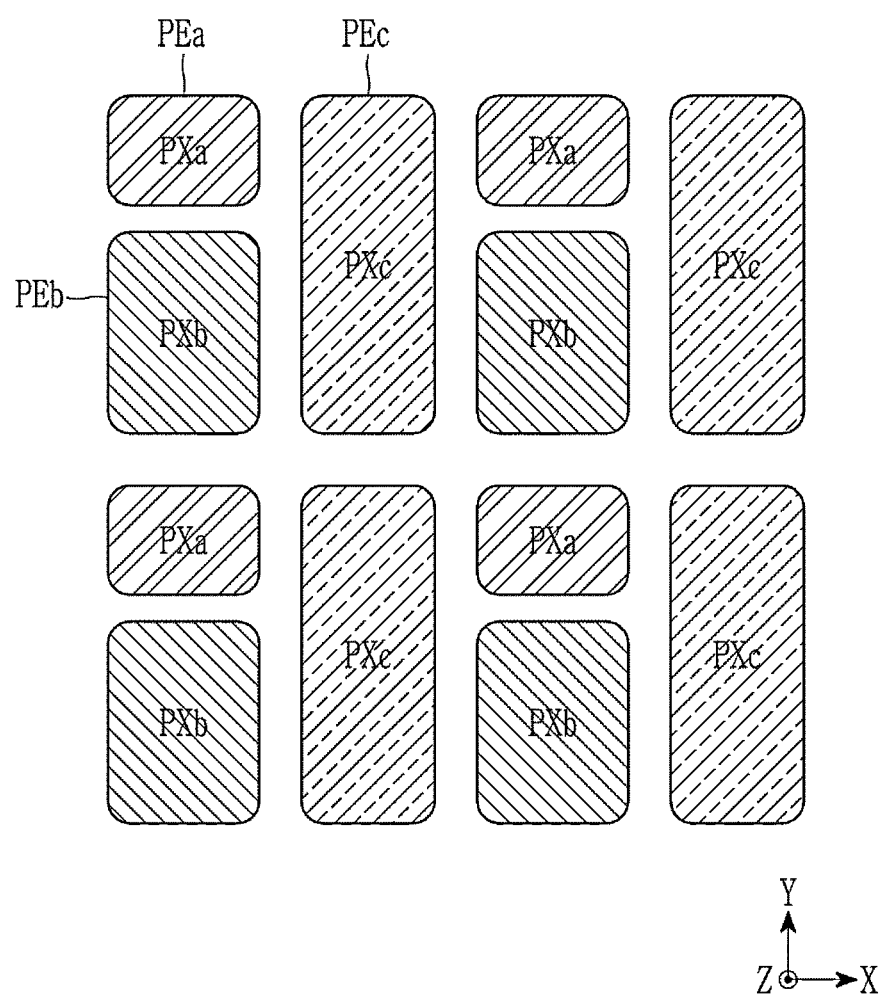
FIG. 2 shows an alignment of pixels of the display device according to the embodiment.

Referring to FIGS. 1 and 2, a display device according to an embodiment will be described.

FIG. 1 is a schematic cross-sectional view of a pixel of a display device according to an embodiment, and FIG. 2 illustrates an alignment of pixels of the display device according to the embodiment.

A display device according to an embodiment includes pixels PX that emit different colors in a plan view on an X-Y plane. Each pixel PX may include a light emitting diode 120 and at least one transistor T for transmitting a driving voltage to the light emitting diode 120.

Referring to FIG. 1, an example of a cross-section structure of a display device stacked in a Z direction that is perpendicular to the X-Y plane will be described.

The display device according to the embodiment may include a substrate 110.

The substrate 110 may include a plastic material such as polyimide, or glass. The substrate 110 may include a flexible material that can be bent or folded, and may be single-layered or multi-layered.

Although it is not illustrated in the drawings, a buffer layer that includes an inorganic insulation material or an organic insulation material may be further disposed on the substrate 110.

A semiconductor AC may be disposed on the substrate 110. The semiconductor AC may include a conductive region and a channel region. The semiconductor AC may include a semiconductor material such as amorphous silicon, polysilicon, an oxide semiconductor, or the like.

A gate insulating layer 111 may be positioned on the semiconductor AC. The gate insulating layer 111 may have a single-layer or multi-layer structure, and may include an inorganic insulating material.

A gate electrode GE may be disposed on the gate insulating layer 111. The gate electrode GE may overlap the channel region of the semiconductor AC. The gate electrode GE may have a single-layer or multi-layer structure, and may include a metallic material such as molybdenum (Mo), aluminum (Al), copper (Cu), and/or titanium (Ti).

An interlayer insulating layer 112 may be positioned on the gate electrode GE. The interlayer insulating layer 112 may have a single-layer or multi-layer structure, and may include an inorganic insulating material or an organic insulating material.

A source electrode SE and a drain electrode DE may be positioned on the interlayer insulating layer 112. The source electrode SE and the drain electrode DE may have a single-layer or multi-layer structure, and may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and/or a combination thereof.

The source electrode SE and the drain electrode DE may be electrically connected with each conductive region of the semiconductor AC through each hole of the interlayer insulating layer 112 and the gate insulating layer 111.

The semiconductor AC, the gate electrode GE, the source electrode SE, and the drain electrode DE form a transistor T.

A protective layer 113 may be disposed on the source electrode SE and the drain electrode DE. The protective layer 113 may include an organic insulating material such as various polymer resins.

A first electrode PE may be positioned on the protective layer 113. The first electrode PE may have a single-layer or multi-layer structure, and may include at least one of a transparent conductive oxide layer and a metal. The transparent conductive oxide layer may be formed of, for example, IZO, IGZO, ITZO, and/or the like.

The first electrode PE is positioned at each pixel PX and is separated and insulated from the first electrode PE of a neighboring (or adjacent) pixel PX.

The first electrode PE may be electrically connected to the drain electrode DE of the transistor T through a hole in the protective layer 113. The first electrode PE may receive an output current to be transferred from the drain electrode DE to a light emitting portion TLEU.

An insulation layer 114 may be disposed on the protective layer 113. The insulation layer 114 may also be referred to as a bank layer or a pixel defining layer, and may include a pixel opening 114a overlapping the first electrode PE. The insulation layer 114 may include an organic insulating material such as polyimide, polyamide, acryl resin, benzocyclobutene, or phenol resin. In embodiments, the insulation layer 114 may further include a black pigment.

The light emitting portion TLEU may be positioned on the first electrode PE. The light emitting portion TLEU includes layers. As shown in FIG. 2, the light emitting portion TLEU includes a layer that is positioned in each pixel opening 114a of the insulation layer 114. The light emitting portion TLEU may include a layer positioned on the top surface of the insulation layer 114 outside the pixel opening 114a as well as inside the pixel opening 114a.

A second electrode CE may be positioned on the light emitting portion TLEU. The second electrode CE may include a transparent conductive material such as ITO, IZO, IGZO, or ITZO.

A second electrode CE of each of the pixels PX may be electrically connected to each other to conduct electricity, and may be formed as an electrode.

The second electrode CE may have a translucent characteristic, and may form a microcavity in which light can reciprocate and resonate, together with the first electrode PE.

The first electrode PE, the light emitting portion TLEU, and the second electrode CE may form a light emitting diode 120. One of the first electrode PE and the second electrode CE may function as a cathode, and the other may function as an anode. In the disclosure, an example in which the first electrode PE is an anode and the second electrode CE is a cathode will be described.

In a plan view, which is an X-Y plane shown in FIG. 2, a light emitting region of a light emitting portion TLEU of each pixel PX may correspond to a region of the first electrode PE and may be positioned within the region of the first electrode PE.

Referring to FIG. 2, the first electrode PE or the light emitting region corresponding to the first electrode PE may be arranged with various regularities in a plan view. In case that pixels PX include pixels representing (or displaying) a first color, a second color, and a third color, a first electrode PEa of a first color pixel PXa, a first electrode PEb of a second color pixel PXb, and a first electrode PEc of a third color pixel PXc may be regularly arranged.

For example, the first electrode PEa of the first color pixel PXa and the first electrode PEb of the second color pixel PXb may be alternately arranged in a Y direction, the first electrode PEc of the third color pixel PXc may be alternately arranged in an X direction with the first electrode PEa of the first color pixel PXa and the first electrode PEb of the second color pixel PXb. The areas of at least two of the first electrode PEa of the first color pixel PXa, the first electrode PEb of the second color pixel PXb, and the first electrode PEc of the third color pixel PXc may be different from each other in a plan view.

For example, the first color may be red, the second color may be green, and the third color may be blue, but the colors are not limited thereto.

An encapsulation layer 115 that seals and protects the light emitting diode 120 may be disposed on the light emitting diode 120. In embodiments, an encapsulation substrate may be provided instead of the encapsulation layer 115.

Figure 3:
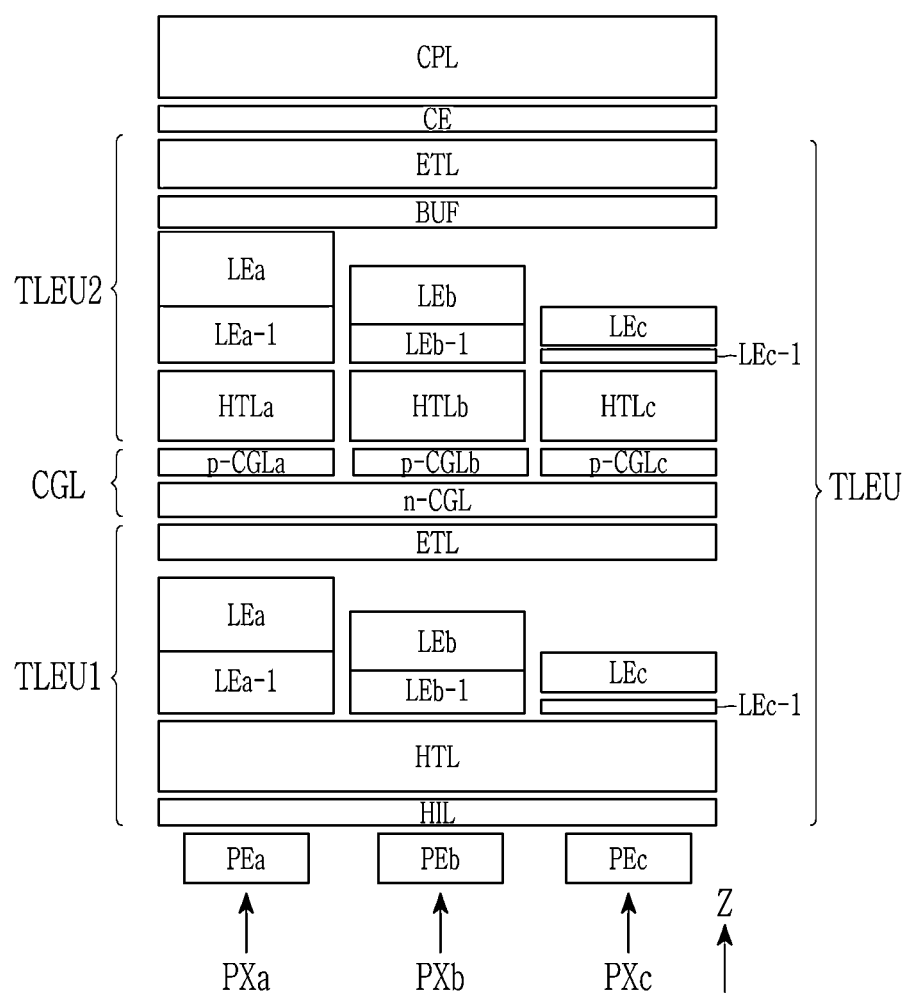
FIG. 3 is a cross-sectional view of light emitting portions of the display device according to the embodiment.

Referring to FIG. 3, together with FIG. 1 and FIG. 2, a stack structure of the light emitting portion TLEU of the display device according to the embodiment will be described.

FIG. 3 is a schematic cross-sectional view of light emitting portions of three neighboring (or adjacent) pixels PXa, PXb, and PXc of the display device according to the embodiment, and illustrates a stack structure of light emitting portions TLEU between the first electrodes PEa, PEb, and PEc and the second electrode CE.

The light emitting portion TLEU according to the embodiment may include sub-light emitting portions TLEU1 and TLEU2 arranged in the Z direction. FIG. 3 illustrates an example that a single light emitting portion TLEU includes two sub-light emitting portions, for example, a first sub-light emitting portion TLEU1 and a second sub-light emitting portion TLEU2. In case that the display device displays an image, both the first sub-light emitting portion TLEU1 and the second sub-light emitting portion TLEU2 emit light so that an image display characteristic of the display device can be improved.

The first sub-light emitting portion TLEU1 may include a hole injection layer HIL, a hole transport layer HTL, emission layers LEa, LEb, and LEc, and an electron transport layer ETL sequentially from the first electrodes PEa, PEb, and PEc.

Each of the hole injection layer HIL, the hole transport layer HTL, and the electron transport layer ETL may be continuously formed as a layer over the pixels PXa, PXb, and PXc. For example, each of the hole injection layer HIL, the hole transport layer HTL, and the electron transport layer ETL may include a layer positioned on the top surface of the insulation layer 114 outside the pixel opening 114a as well as inside the pixel opening 114a of the insulation layer 114 of FIG. 1.

The emission layers LEa, LEb, and LEc of the respective pixel PXa, PXb, and PXc may be formed in the corresponding pixels PXa, PXb, and PXc, and may be separated from the emission layers LEa, LEb, and LEc of neighboring pixels PXa, PXb, and PXc. For example, the emission layers LEa, LEb, and LEc may be mostly formed in the pixel opening 114a of the insulation layer 114 shown in FIG. 1. However, edge portions of emission layers LEa, LEb, and LEc of partially neighboring pixels PXa, PXb, and PXc may be partially overlapped with each other.

The emission layers LEa, LEb, and LEc may include an organic material emitting light of primary colors represented (or displayed) by the respective pixels PXa, PXb, and PXc.

In the respective pixels PXa, PXb, and PXc, auxiliary layers LEa-1, LEb-1, and LEc-1 may be further formed between the emission layers LEa, LEb, and LEc and the hole transport layer HTL. The auxiliary layers LEa-1, LEb-1, and LEc-1 may have a thickness at which a length of a path of light reciprocating between the first electrodes PEa, PEb, and PEc and the second electrode CE after reflection from the electrodes PEa, PEb, PEc, and CE, is adjusted according to a resonance condition. In addition, at least a part of the auxiliary layers LEa-1, LEb-1, and LEc-1, for example, the auxiliary layer LEc-1 of the third color pixel PXc, may block electrons of the emission layers LEa, LEb, and LEc from passing to the hole transport layer HTL.

The auxiliary layers LEa-1, LEb-1, and LEc-1 may be omitted in other embodiments.

Similar to the emission layers LEa, LEb, and LEc, edge portions of auxiliary layers LEa-1, LEb-1, and LEc-1 of some neighboring pixels PXa, PXb, and PXc may partially overlap each other.

In case that the first color pixel PXa expresses (or displays) red, the second color pixel PXb expresses (or displays) green, and the third color pixel PXc expresses (or displays) blue, the auxiliary layers LEa-1 of the first color pixel PXa may have the thickest thickness in the Z direction, and the auxiliary layers LEc-1 of the third color pixel PXc may have the thinnest thickness in the Z direction. However, the embodiments are not limited thereto.

At least a part of the hole injection layer HIL, the hole transport layer HTL, and the electron transport layer ETL of the first sub-light emitting portion TLEU1 may be omitted.

The second sub-light emitting portion TLEU2 may include hole transport layers HTLa, HTLb, and HTLc, emission layers LEa, LEb, and LEc, a buffer layer BUF, and an electron transport layer ETL in order from the bottom.

The emission layers LEa, LEb, and LEc of the respective pixels PXa, PXb, and PXc may have same functions and characteristics as the emission layers LEa, LEb, and LEc of the first sub-light emitting portion TLEU1.

Similar to the emission layers LEa, LEb, and LEc, most of hole transport layers HTLa, HTLb, and HTLc of the respective pixel PXa, PXb, and PXc may be formed in the corresponding pixels PXa, PXb, and PXc, and may be separated from the hole transport layers HTLa, HTLb, and HTLc of neighboring pixels PXa, PXb, and PXc. For example, most of the hole transport layers HTLa, HTLb, and HTLc may be formed in the pixel opening 114a of the insulation layer 114 of FIG. 1. However, edge portions of hole transport layers HTLa, HTLb, and HTLc of partially neighboring pixels PXa, PXb, and PXc may be partially overlapped with each other.

In the respective pixels PXa, PXb, and PXc, auxiliary layers LEa-1, LEb-1, and LEc-1 may be further formed between the emission layers LEa, LEb, and LEc and the hole transport layers HTLa, HTLb, and HTLc. The auxiliary layers LEa-1, LEb-1, and LEc-1 may have same functions and characteristics as the auxiliary layers LEa-1, LEb-1, and LEc-1 of the first sub-light emitting portion TLEU1.

Each of the buffer layer BUF and the electron transport layer ETL may be continuously formed as a layer over the pixels PXa, PXb, and PXc. For example, the buffer layer BUF and the electron transport layer ETL may include a layer positioned on the top surface of the insulation layer 114 outside the pixel opening 114a as well as inside the pixel opening 114a of the above-described insulation layer 114 of FIG. 1.

The buffer layer BUF may include an insulating material.

At least a part of the buffer layer BUF and the electron transport layer ETL may be omitted.

A charge generation layer CGL is disposed between the first sub-light emitting portion TLEU1 and the second sub-light emitting portion TLEU2 that neighbor (or are adjacent to) each other in the Z direction.

The charge generation layer CGL may include an N-type charge generation layer n-CGL and P-type charge generation layers p-CGLa, p-CGLb, and p-CGLc. In the respective pixels PXa, PXb, and PXc, the N-type charge generation layer n-CGL and the P-type charge generation layers p-CGLa, p-CGLb, and p-CGLc may contact each other to form an NP junction. Electrons and holes can be simultaneously generated between the N-type charge generation layer n-CGL and the P-type charge generation layers p-CGLa, p-CGLb, and p-CGLc by the NP junction. The generated electrons are transferred to the first sub-light emitting portion TLEU1 through the N-type charge generation layer n-CGL, and the generated holes are transferred to the second sub-light emitting portion TLEU2 through the P-type charge generation layers p-CGLa, p-CGLb, and p-CGLc.

The N-type charge generation layer n-CGL may be continuously formed as a layer over the pixels PXa, PXb, and PXc. For example, the N-type charge generation layer n-CGL may include a layer positioned on the top surface of the insulation layer 114 outside the pixel opening 114a as well as inside the pixel opening 114a of the insulation layer 114 of FIG. 1.

Most of the P-type charge generation layers p-CGLa, p-CGLb, and p-CGLc of the respective pixels PXa, PXb, and PXc may be formed in the corresponding pixels PXa, PXb, and PXc, respectively, and may be separated from the P-type charge generation layers p-CGLa, p-CGLb, and p-CGLc of the neighboring pixels PXa, PXb, and PXc. For example, most of the P-type charge generation layers p-CGLa, p-CGLb, and p-CGLc may be formed in the pixel opening 114a of the insulation layer 114 of FIG. 1. However, edge portions of the P-type charge generation layers p-CGLa, p-CGLb, and p-CGLc of some neighboring pixels PXa, PXb, PXc may partially overlap each other.

Conductivity of the N-type charge generation layer n-CGL may be lower than conductivity of the P-type charge generation layers p-CGLa, p-CGLb, and p-CGLc, but the embodiments are not limited thereto.

In case that a continuous P-type charge generation layer is formed for the pixels PXa, PXb, and PXc, a current of a pixel PXa, PXb, or PXc may flow to the neighboring pixels PXa, PXb, and PXc through the continuous P-type charge generation layer when the display device is driven, and thus an unintended pixel may also emit light. For example, when driving a pixel with a relatively high driving voltage such as a blue pixel, a high current caused by a high driving voltage may flow to a neighboring pixel of a different color through the P-type charge generation layer, and light of a different color may be leaked and emitted. This is called "leaky emission."

However, according to the embodiment, P-type charge generation layers p-CGLa, p-CGLb, and p-CGLc are formed separately in the respective pixels PXa, PXb, and PXc.

Accordingly, as described above, it is possible to prevent the leaky emission between neighboring pixels of different colors.

According to another embodiment, the N-type charge generation layer n-CGL may also be formed separately for the respective pixels PXa, PXb, and PXc. In this case, the N-type charge generation layer n-CGL of each pixel may be mostly formed in the pixel opening 114a of the insulation layer 114 as described above referring to FIG. 1.

Referring to FIG. 3, a capping layer CPL, which is an insulation layer, may be further formed on the second electrode CE.

Figure 4:
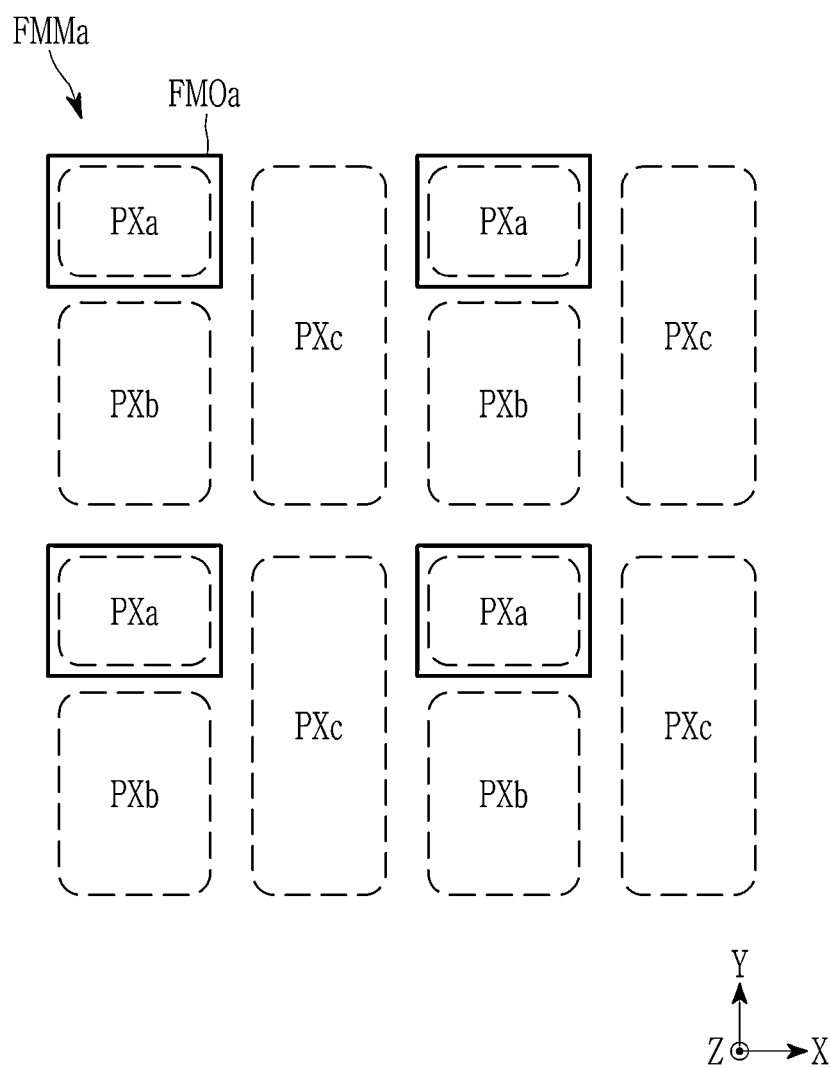
FIG. 4 is a top plan view of an opening of a mask for forming a pixel of a color of a display device according to an embodiment.
Figure 5:
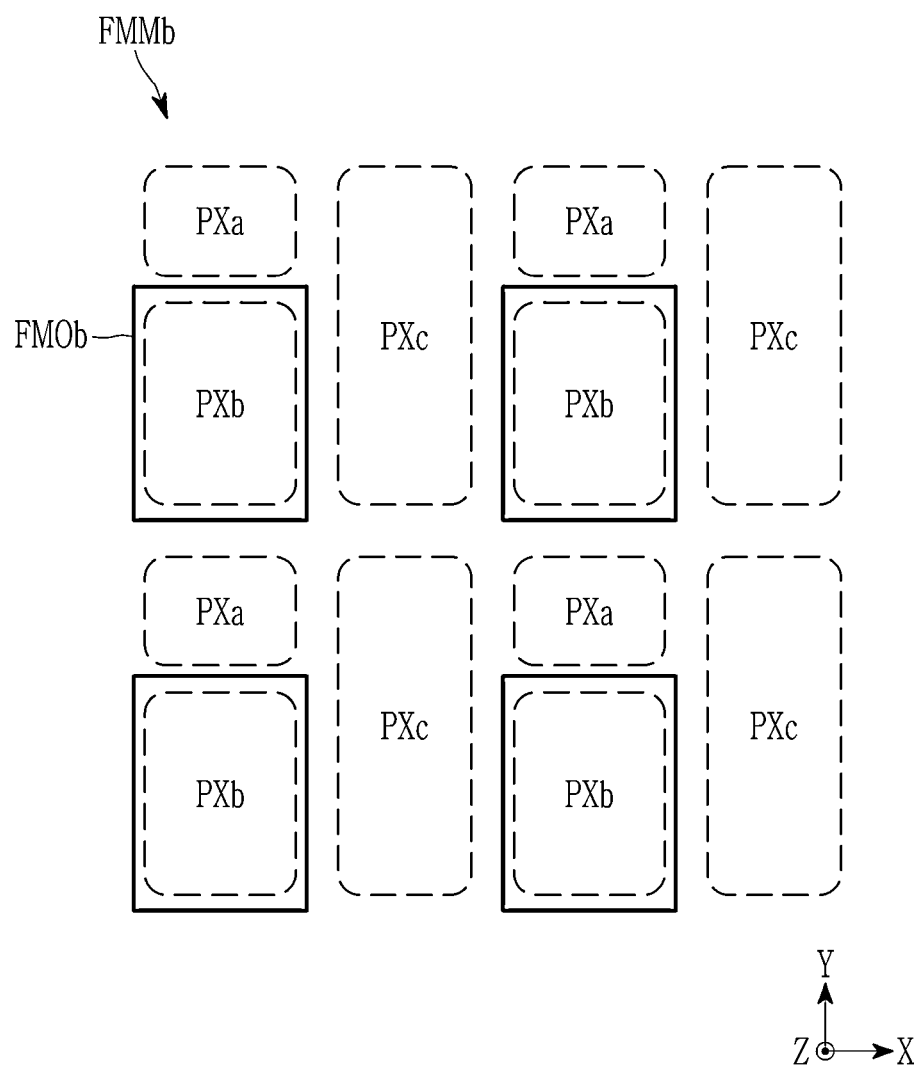
FIG. 5 is a top plan view of an opening of a mask for forming a pixel of a color of a display device according to an embodiment.
Figure 6:
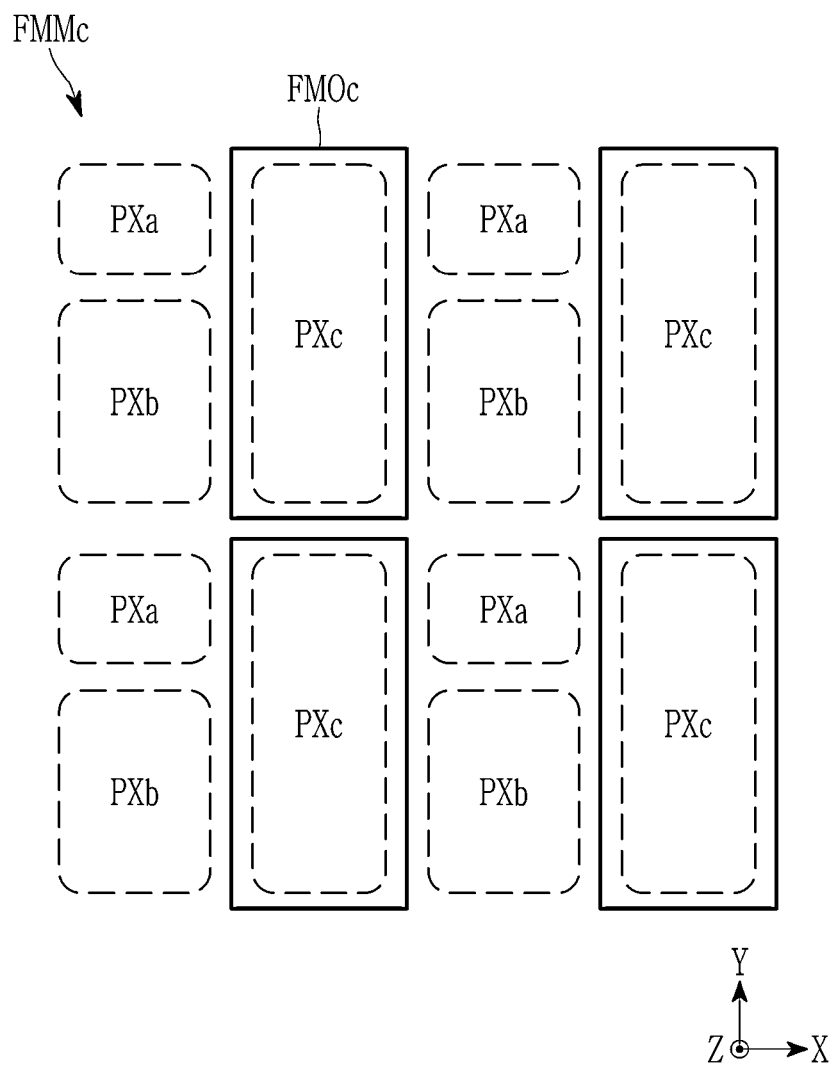
FIG. 6 is a top plan view of an opening of a mask for forming a pixel of a color of a display device according to an embodiment.

Referring to FIG. 4 to FIG. 6, together with FIG. 1 to FIG. 3, a method for manufacturing the light emitting portion of the display device according to an embodiment will be described.

FIG. 4 is a schematic top plan view of an opening of a mask for forming a pixel of a color of a display device according to an embodiment, FIG. 5 is a schematic top plan view of an opening of a mask for forming a pixel of a color of a display device according to an embodiment, and FIG. 6 is a schematic top plan view of an opening of a mask for forming a pixel of a color of a display device according to an embodiment.

The first electrodes PEa, PEb, and PEc may be formed on the substrate and the hole injection layer HIL and the hole transport layer HTL may be sequentially stacked on the entire substrate. In this case, an open mask having an opening for pixels PXa, PXb, and PXc may be used in a deposition chamber.

Auxiliary layers LEa-1, LEb-1, and LEc-1 and emission layers LEa, LEb, and LEc may be sequentially stacked on the substrate on which the hole transport layer HTL is formed.

In this case, as shown in FIG. 4, the auxiliary layers LEa-1 and the emission layer LEa of the first color pixel PXa may be formed by a deposition process using a mask FMMa having an opening FMOa that corresponds to the light emitting region of the first color pixel PXa.

As shown in FIG. 5, the auxiliary layers LEb-1 and the emission layer LEb of the second color pixel PXb may be formed by a deposition process using a mask FMMb having an opening FMOb that corresponds to the light emitting region of the second color pixel PXb.

As shown in FIG. 6, the auxiliary layers LEc-1 and the emission layer LEc of the third color pixel PXc may be formed by a deposition process using a mask FMMc having an opening FMOc that corresponds to the light emitting region of the third color pixel PXc.

Each of the masks FMMa, FMMb, and FMMc may be, for example, a fine metal mask.

The electron transport layer ETL and the N-type charge generation layer n-CGL may be sequentially stacked on the entire substrate. Thus, a first sub-light emitting portion TLEU1 may be completed, and the N-type charge generation layer n-CGL may be formed thereon. In this case, an open mask having an opening for pixels PXa, PXb, and PXc may be used in the deposition chamber. The N-type charge generation layer n-CGL may be formed by using a material of the electron transport layer ETL as a host and doping and depositing a N-type dopant material.

P-type charge generation layers p-CGLa, p-CGLb, and p-CGLc and hole transport layers HTLa, HTLb, and HTLc may be sequentially stacked on the substrate. In this case, the deposition processes using the masks FMMa, FMMb, and FMMc respectively shown in FIG. 4 to FIG. 6 may be used.

For example, the P-type charge generation layer p-CGLa and the hole transport layer HTLa may be sequentially stacked in the first color pixel PXa by using the mask FMMa having the opening FMOa corresponding to the first color pixel PXa in a deposition chamber.

Before or after forming the auxiliary layers LEa-1 and the emission layer LEa of the first color pixel PXa, the P-type charge generation layer p-CGLb and the hole transport layer HTLb, or the P-type charge generation layer p-CGLc and the hole transport layer HTLc, may be sequentially stacked in the second color pixel PXb or the third color pixel PXc by using the mask FMMb or the mask FMMc, respectively.

Therefore, the p-type charge generating layers p-CGLa, p-CGLb, and p-CGLc and the hole transport layers HTLa, HTLb, and HTLc deposited sequentially in each of the pixels PXa, PXb, and PXc may be aligned with each other.

In the respective pixels PXa, PXb, and PXc, the auxiliary layers LEa-1, LEb-1, and LEc-1 and the emission layers LEa, LEb, and LEc may also be formed by the deposition processes using the masks FMMa, FMMb, and FMMc as shown in FIG. 4 to FIG. 6. In this case, the deposition of the emission layers LEa, LEb, and LEc may be carried out in a chamber that is different from or the same as the chamber in which the P-type charge generation layers p-CGLa, p-CGLb, and p-CGLc and the hole transport layers HTLa, HTLb, and HTLc are deposited. The auxiliary layers LEa-1, LEb-1, and LEc-1 may be deposited prior to deposition of the emission layers LEa, LEb, and LEc.

In the embodiment, in the respective pixels PXa, PXb, and PXc, the deposition of the p-type charge generation layers p-CGLa, p-CGLb, and p-CGLc and the hole transport layers HTLa, HTLb, and HTLc may be continuously performed in a same chamber.

Thus, in the respective pixels PXa, PXb, and PXc, the P-type charge generation layers p-CGLa, p-CGLb, and p-CGLc and the hole transport layers HTLa, HTLb, and HTLc may be deposited by using a mask FMMa, FMMb, or FMMc, and thus they may be substantially aligned with each other on the X-Y plane. However, since the P-type charge generation layers p-CGLa, p-CGLb, and p-CGLc and the hole transport layers HTLa, HTLb, and HTLc are deposited using different masks between neighboring pixels PXa, PXb, and PXc, they may be further separated from each other, or some of edges may overlap each other due to an alignment error of the masks FMMa, FMMb, and FMMc.

In the respective pixels PXa, PXb, and PXc, each of the emission layers LEa, LEb, and LEc may be stacked with same masks FMMa, FMMb, and FMMc after forming P-type charge generation layers p-CGLa, p-CGLb, and p-CGLc and hole transport layers HTLa, HTLb, and HTLc of the corresponding pixels. In this case, the respective emission layers LEa, LEb, and LEc may be substantially aligned to the corresponding P-type charge generation layers p-CGLa, p-CGLb, and p-CGLc and the hole transport layers HTLa, HTLb, and HTLc. However, in case that the emission layers LEa, LEb, and LEc of the respective pixels PXa, PXb, and PXc are deposited by a separate process, the masks FMMa, FMMb, and FMMc may be realigned, and in the respective pixels PXa, In PXb, and PXc, the emission layers LEa, LEb, and LEc may not be precisely aligned with the underlying P-type charge generation layers p-CGLa, p-CGLb, and p-CGLc and hole transport layer HTLa, HTLb, and HTLc due to the alignment error of the masks FMMa, FMMb, or FMMc.

Since the emission layers LEa, LEb, and LEc are deposited using different masks FMMa, FMMb, and FMMc between the neighboring pixels PXa, PXb, and PXc, they may be spaced from each other due to an alignment error of the masks FMMa, FMMb, and FMMc, or part of the edges thereof may overlap each other.

Together with the drawings described above, referring to FIG. 7 to FIG. 9, features of the display device according to the embodiment will be compared with comparative examples.

Figure 7:
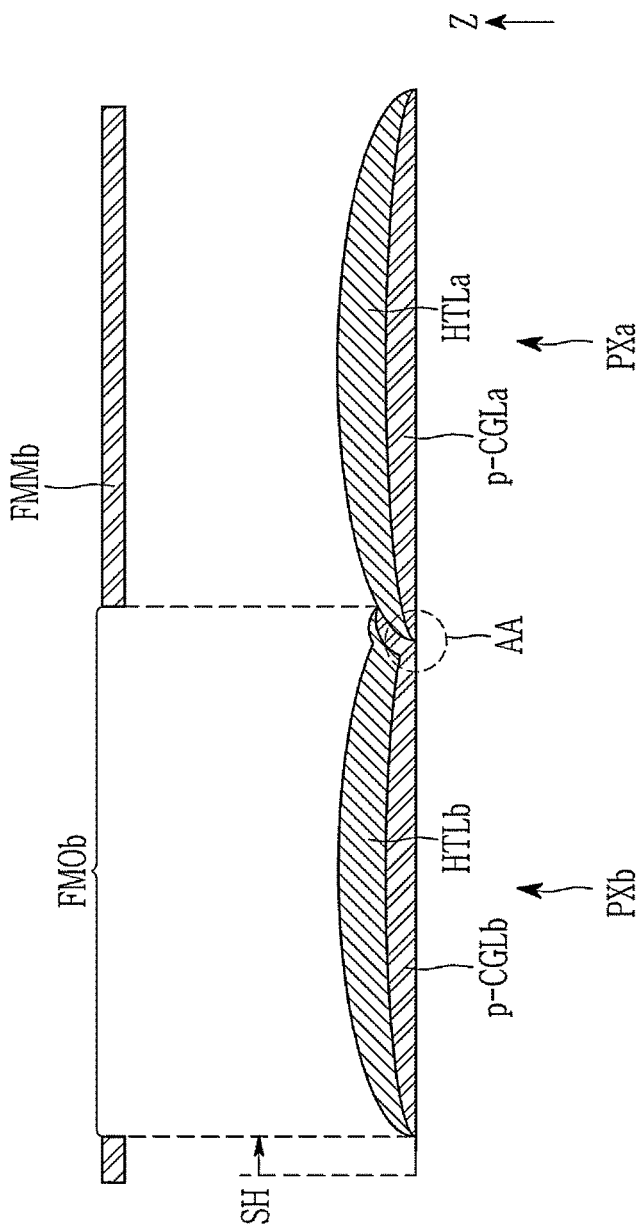
FIG. 7 shows a partial layer of a light emitting portion of neighboring pixels of a display device according to a comparative example.

FIG. 7 is a schematic cross-sectional view of a partial layer of a light emitting portion of neighboring pixels of a display device, which is a comparative example in which a P-type charge generation layer p-CGLa and a hole transport layer HTLa of a first color pixel PXa are formed and a P-type charge generation layer p-CGLb and a hole transport layer HTLb of a second color pixel PXb are formed using a mask FMMb.

Referring to FIG. 7, in case that an alignment error SH occurs and thus the mask FMMb is aligned on a side, a part of edges of the P-type charge generation layer p-CGLb and the hole transport layer HTLb of the second color pixel PXb deposited in response to the opening FMOb may be partially overlapped with edges of the P-type charge generation layer p-CGLa and the hole transport layer HTLa of the first color pixel PXa. As shown in region AA in FIG. 7, a high-risk region in which the P-type charge generation layer p-CGLa of the first color pixel PXa and the P-type charge generation layer p-CGLb of the second color pixel PXb are likely to contact each other may occur.

The P-type charge generation layers p-CGLa and p-CGLb of the neighboring pixels PXa and PXb may be electrically connected to each other as if they are formed as a continuous layer. In case that there is a difference in driving voltage of neighboring pixels PXa and PXb, a leakage current may flow from a pixel with a high driving voltage to a pixel with a low driving voltage through the P-type charge generation layers p-CGLa and p-CGLb contacting each other between the two pixels PXa and PXb, which may cause leaky emission. For example, in case that a pixel having a high driving voltage is driven, an emission layer of a pixel of a different color adjacent to the pixel is also driven, which may cause leaky emission.

Figure 8:
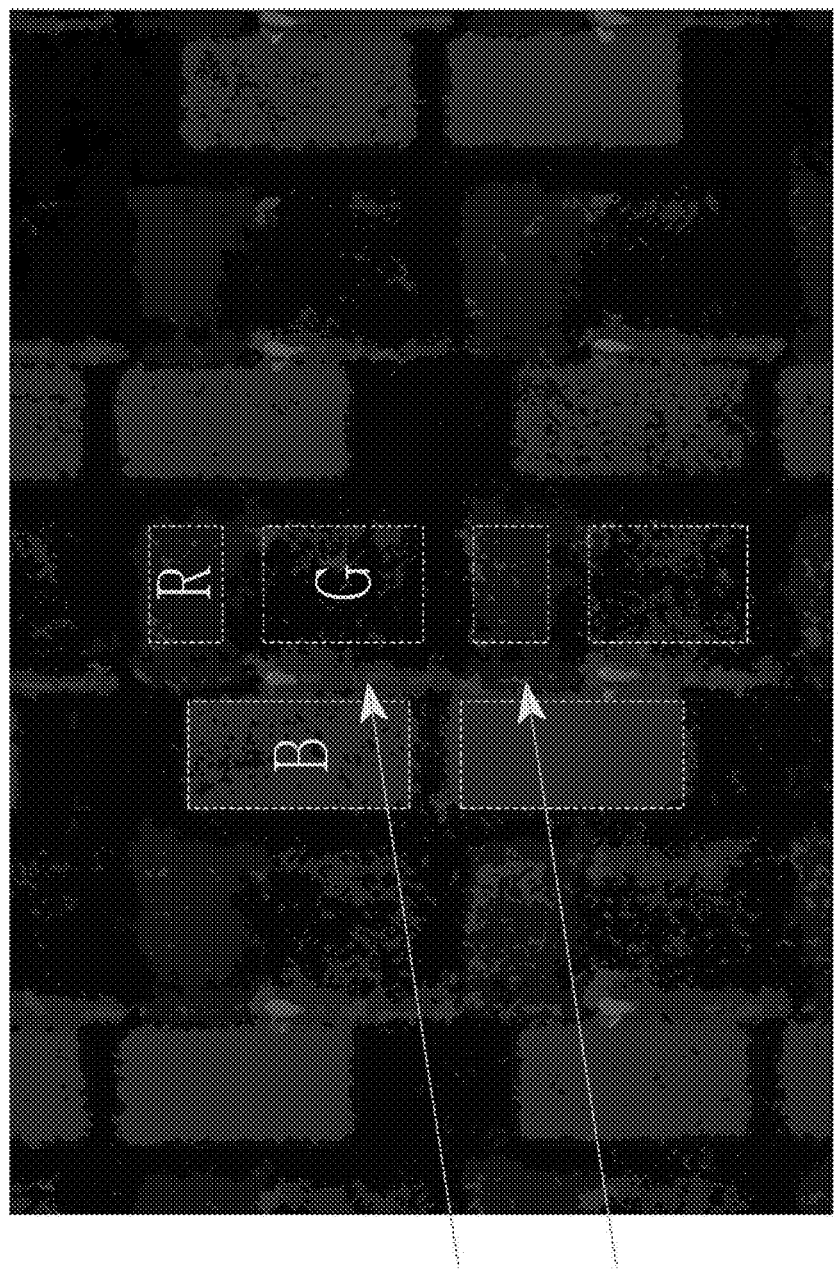
FIG. 8 is a picture showing leaky emission between neighboring pixels of a display device according to a comparative example.
Figure 9:
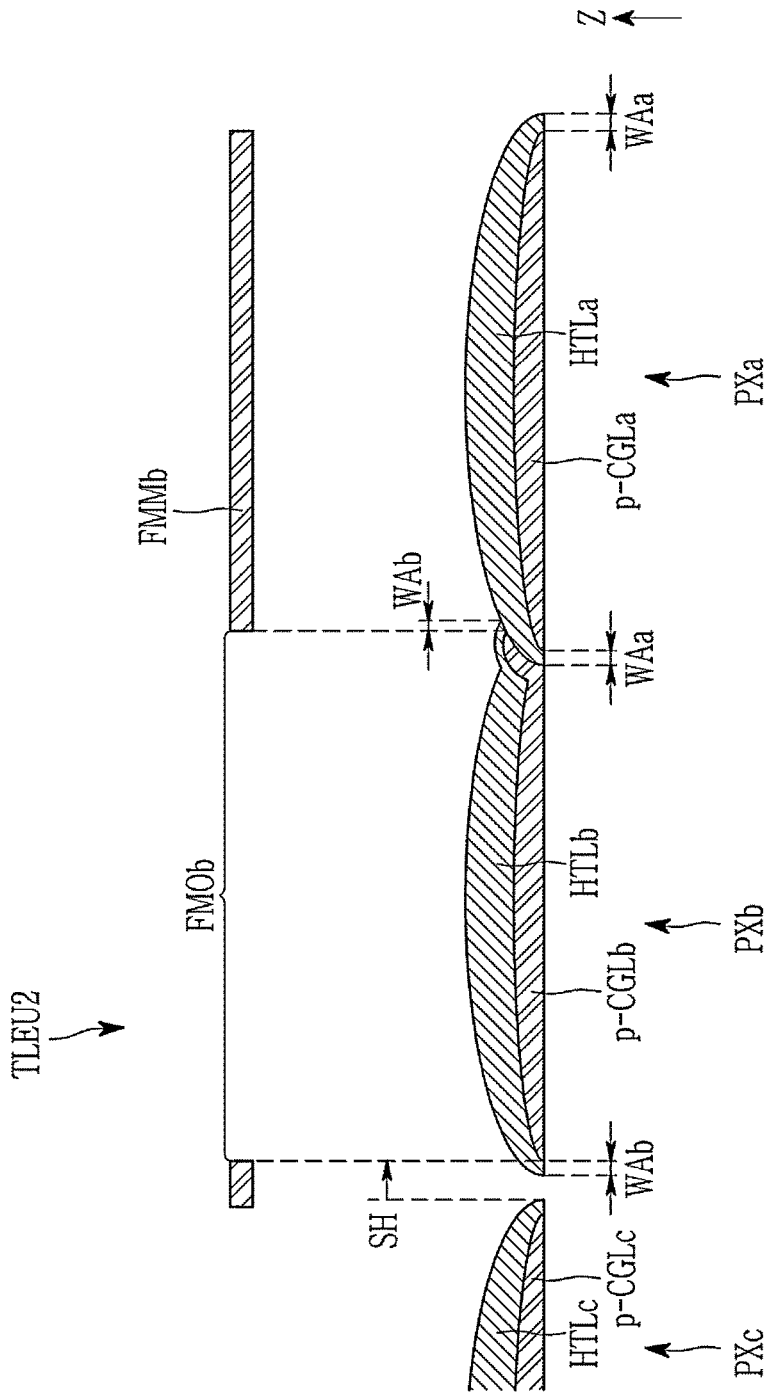
FIG. 9 is a cross-sectional view that illustrates layers of a light emitting portion of a neighboring pixel of a display device according to an embodiment.

FIG. 8 is a picture showing leaky emission between neighboring pixels of a display device according to a comparative example, and FIG. 9 is a schematic cross-sectional view that illustrates some layers of a light emitting portion of a neighboring pixel of a display device according to an embodiment.

Referring to FIG. 8, for example, when blue color is expressed (or displayed) by emitting only a blue pixel B, a current by a relatively high driving voltage of the blue pixel B may flow through the P-type charge generation layer of a green pixel G or the P-type charge generation layer of a red pixel R, which is a neighboring pixel contacting the P-type charge generation layer of the blue pixel B as shown in region AA of FIG. 7, so that the emission layer of the green pixel G or the red pixel R emits light, which may cause color mixing. In this case, a driving voltage of the blue pixel B may be higher than a driving voltage of the green pixel G or the red pixel R.

In comparison with FIG. 7, the blue pixel B of FIG. 8 may be the second color pixel PXb of FIG. 7, and the green pixel G and the red pixel R of FIG. 8 may be the first color pixel PXa of FIG. 7. In case that an alignment error SH occurs and thus the P-type charge generation layer p-CGLb of the blue pixel B is aligned to the right side, the P-type charge generation layer p-CGLb of the blue pixel B overlaps the emission layer of the green pixel G or the red pixel R, which is the first color pixel PXa, and thus the emission layer of the green pixel G or the emission layer of the red pixel R may emit light as shown in a region marked by the arrow in FIG. 8.

However, according to the embodiment, as shown in FIG. 9, the hole transport layer HTLb is disposed between the neighboring (or adjacent) P-type charge generation layers p-CGLa and p-CGLb and thus even if some edges of the neighboring P-type charge generation layers p-CGLa and p-CGLb overlap each other, they can be reliably insulated from each other.

A part of the edge of the P-type charge generation layer p-CGLb of the second color pixel PXb is positioned on the edge of the hole transport layer HTLa disposed on the P-type charge generation layer p-CGLa of the first color pixel PXa, and a top surface of a part of the edge of the hole transport layer HTLa may contact the P-type charge generation layer p-CGLb of the second color pixel PXb.

An edge portion of the hole transport layer HTLb disposed between the neighboring P-type charge generation layers p-CGLa and p-CGLb may contact a top surface of a layer disposed below a p-type charge generation layer p-CGL, for example, a top surface of the n-type change generation layer n-CGL, as shown in FIG. 3.

In the respective pixels PXa, PXb, and PXc, a width of the hole transport layer HTLa, HTLb, and HTLc is greater than a width of the P-type charge generation layers p-CGLa, p-CGLb, and p-CGLc in a plan view, and the hole transport layers HTLa, HTLb, and HTLc can completely cover the corresponding P-type charge generation layers p-CGLa, p-CGLb, and p-CGLc, respectively.

For example, in the first color pixel PXa, an edge of the hole transport layer HTLa may be larger than an edge of the corresponding P-type charge generation layer p-CGLa by a first width WAa. In the second color pixel PXb, an edge of the hole transport layer HTLb may be larger than an edge of the corresponding P-type charge generation layer p-CGLb by a second width WAb. Each of the first width WAa and the second width WAb is greater than zero.

In the respective pixels PXa, PXb, and PXc, a width difference between the corresponding P-type charge generation layers p-CGLa, p-CGLb, and p-CGLc and the hole transport layers HTLa, HTLb, and HTLc may be different or the same. For example, the first width WAa and the second width WAb may be the same as or different from each other.

As the P-type charge generation layer p-CGLb of the second color pixel PXb has an alignment error SH at the right side, the left side of the P-type charge generation layer p-CGLb may be further distanced from a P-type charge generation layer p-CGLc and a hole transport layer HTLc of its neighboring (or adjacent) third color pixel PXc.

In such a method of manufacturing the display device, an incidence angle of a deposition source of a P-type dopant of the P-type charge generation layers p-CGLa, p-CGLb, and p-CGLc may be larger than an incident angle of a deposition source of a material (a host of the P-type charge generation layer may also be a same material) of the hole transport layers HTLa, HTLb, and HTLc such that the deposition process can be carried out. Accordingly, an area where the hole transport layers HTLa, HTLb, and HTLc are deposited may be larger than an area where the P-type charge generation layers p-CGLa, p-CGLb, and p-CGLc are deposited, and thus the hole transport layers HTLa, HTLb, and HTLc can completely surround the P-type charge generation layers p-CGLa, p-CGLb, and p-CGLc. Accordingly, the P-type charge generation layers p-CGLa, p-CGLb, and p-CGLc of neighboring pixels may be completely separated from each other.

Thus, although the P-type charge generation layers p-CGLa and p-CGLb of the neighboring pixels PXa and PXb overlap each other in the Z direction or are formed close to each other in a plan view, a leakage current can be prevented from flowing between the neighboring P-type charge generation layers p-CGLa and p-CGLb, thereby preventing unwanted leaky emission from neighboring pixels of different colors.

Figure 10:
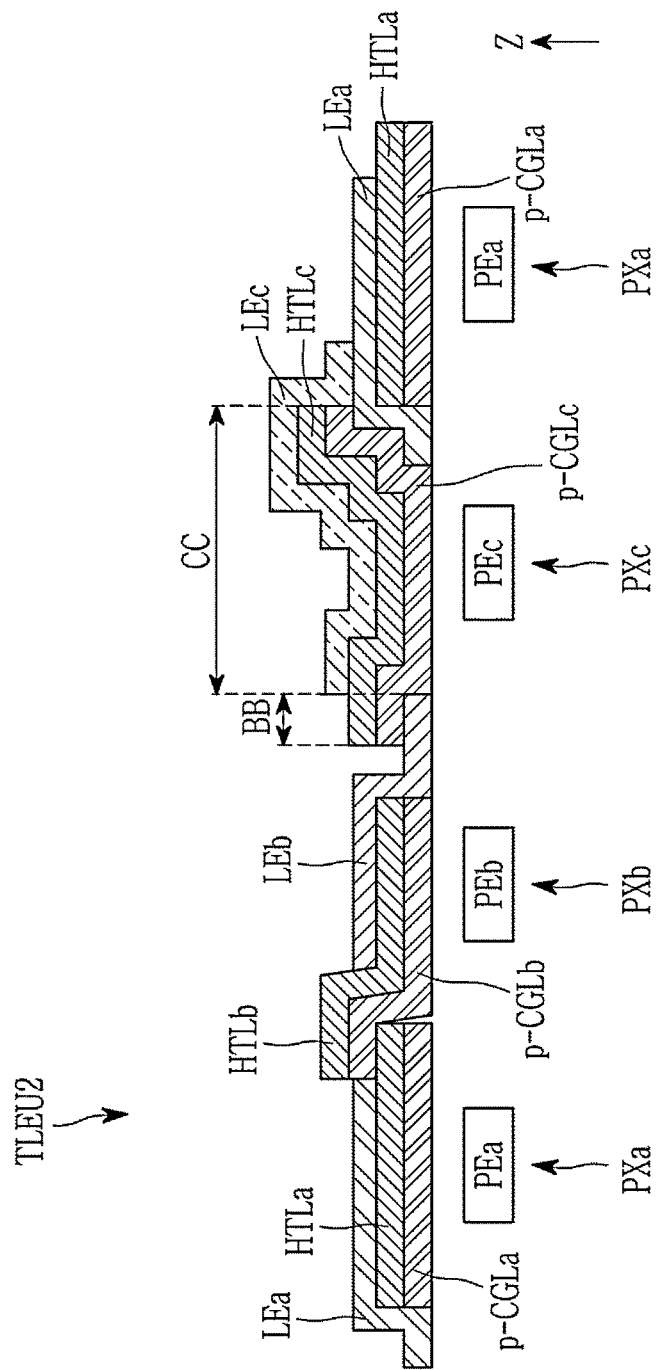
FIG. 10 is a cross-sectional view of layers of a light emitting portion of pixels of a display device according to an embodiment.
Figure 11:
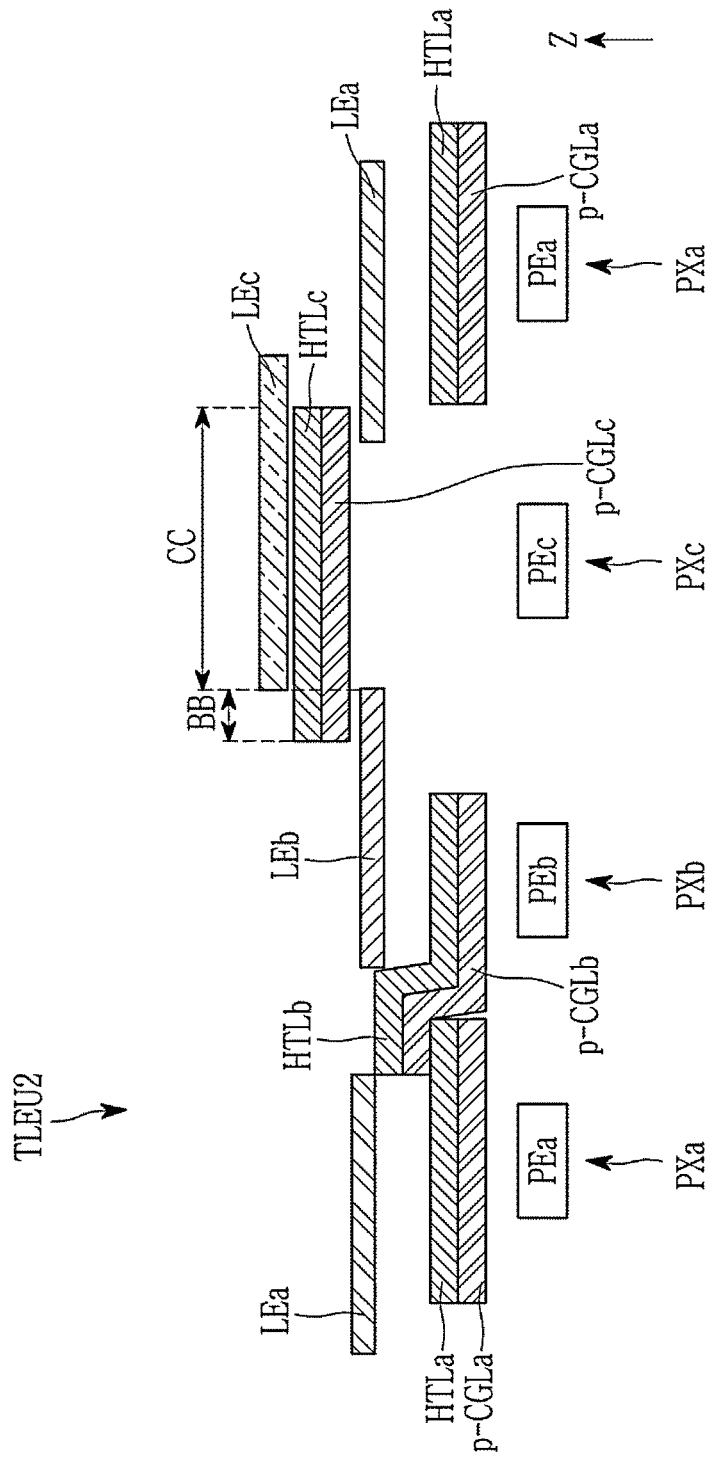
FIG. 11 shows the stacking order of layers shown in FIG. 1.

Referring to FIG. 10 and FIG. 11, a display device according to an embodiment will be described.

FIG. 10 is a schematic cross-sectional view of some layers of a light emitting portion of pixels of a display device according to an embodiment, and FIG. 11 illustrates the stacking order of layers shown in FIG. 10.

A display device of this embodiment may include a stacking structure of P-type charge generation layers p-CGLa, p-CGLb, and p-CGLc, hole transport layers HTLa, HTLb, and HTLc, and emission layers LEa, LEb, and LEc of a second sub-light emitting portion TLEU2.

For example, among neighboring pixels PXa, PXb, PXc of different colors, P-type charge generation layers p-CGLa and p-CGLb, hole transport layers HTLa and HTLb, and emission layers LEa and LEb of two pixels (for example, PXa and PXb) may be formed first, and then a P-type charge generation layer p-CGLc, a hole transport layer HTLc, and an emission layer LEc of the remaining pixel (for example, PXc) may be sequentially formed.

After the P-type charge generation layers p-CGLa and p-CGLb and the hole transport layers HTLa and HTLb of the two pixels are formed, the emission layers LEa and LEb of the two pixels may be formed sequentially.

The two pixels formed first may be a first color pixel PXa and a second color pixel PXb, and the subsequently formed pixel may be a third color pixel PXc.

The third color pixel PXc formed last may be a pixel driven with the highest driving voltage among the three pixels PXa, PXb, and PXc. Driving voltages of the first color pixel PXa and the second color pixel PXb may be similar to or the same as each other.

In the embodiment, the P-type charge generation layer p-CGLc of the third color pixel PXc with a high driving voltage may be formed later than the emission layers LEa and LEb of the first color pixel PXa and the second color pixel PXb. Accordingly, the emission layers LEa and LEb of the first color pixel PXa and the second color pixel PXb may be positioned below the P-type charge generation layer p-CGLc of the third color pixel PXc. Therefore, in case that only the third color pixel PXc is driven, the emission layers LEa and LEb of the neighboring first color pixel PXa and the second color pixel PXb may emit no light even if a region where the emission layers LEa and LEb overlap the P-type charge generation layer p-CGLc of the third color pixel PXc exists.

For example, although a part of the emission layer LEb of the second color pixel PXb overlaps the P-type charge generation layer p-CGL of the third color pixel PXc in region BB due to a mask alignment error, no light is emitted from an emission layer LEb in region BB. In contrast, the emission layer LEc of the third color pixel PXc may normally emit light in region CC where the emission layer LEc of the third color pixel PXc overlaps the P-type charge generation layer p-CGLc. When the third color pixel PXc is driven, there is no light leakage from neighboring pixels of other colors, and thus color mixing can be prevented and image quality can be improved.

In the first color pixel PXa, an undesired light emission may also be prevented in the same or similar way, and thus leaky emission may be prevented.

For example, as shown in FIG. 10, a part of an edge of the P-type charge generation layer p-CGLc of the third color pixel PXc may be positioned on the emission layer LEa of the first color pixel PXa to overlap the emission layer LEa of the first color pixel PXa. The P-type charge generation layer p-CGLc of the third color pixel PXc may be separated from the p-type charge generation layer p-CGLa of the first color pixel PXa and/or the P-type charge generation layer p-CGLb of the second color pixel PXb.

Also, a part of another edge of the P-type charge generation layer p-CGLc of the third color pixel PXc may be positioned over the emission layer LEb of the second color pixel PXb, as shown in FIG. 10, and thus may overlap the emission layer LEb of the second color pixel PXb. The part of another edge of the P-type charge generation layer p-CGLc of the third color pixel PXc may be or may not be spaced from the emission layer LEb of the second color pixel PXb.

Figure 12:
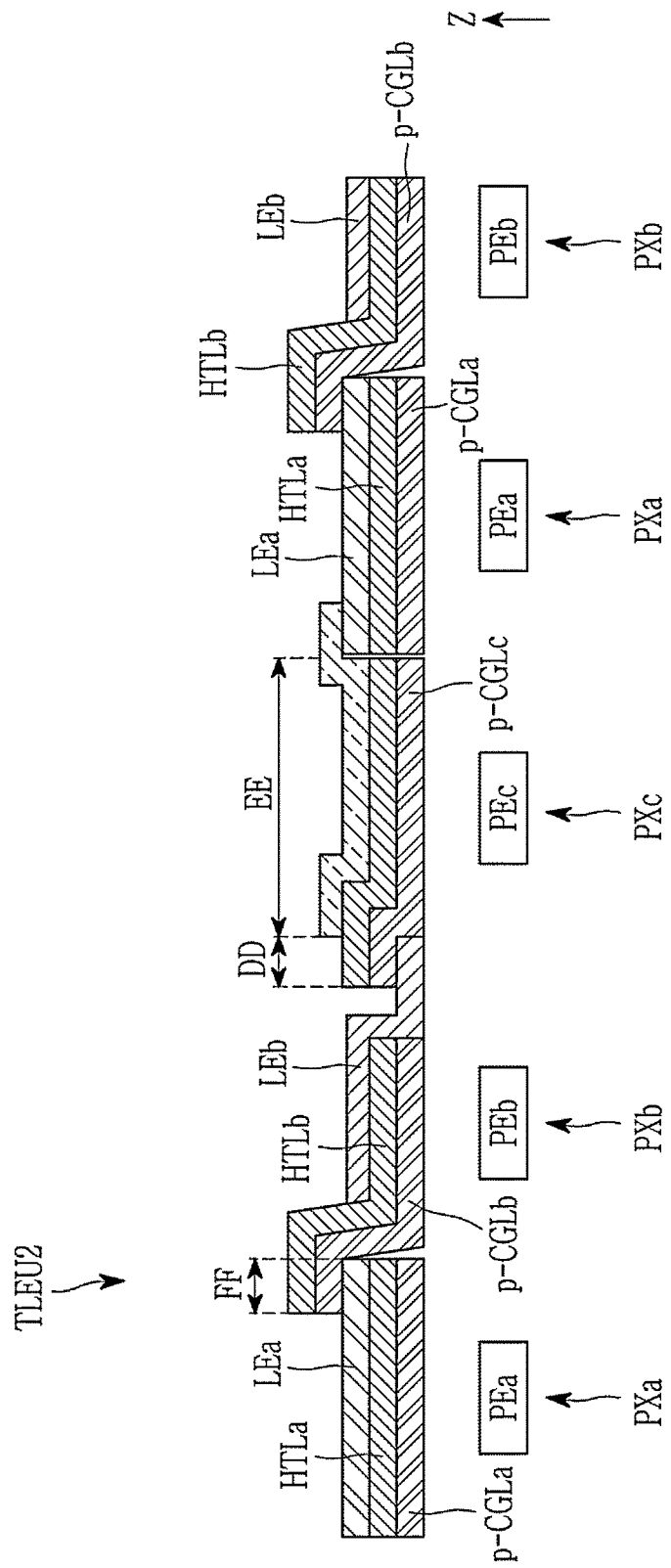
FIG. 12 is a cross-sectional view of layers of a light emitting portion of pixels of a display device according to an embodiment.
Figure 13:
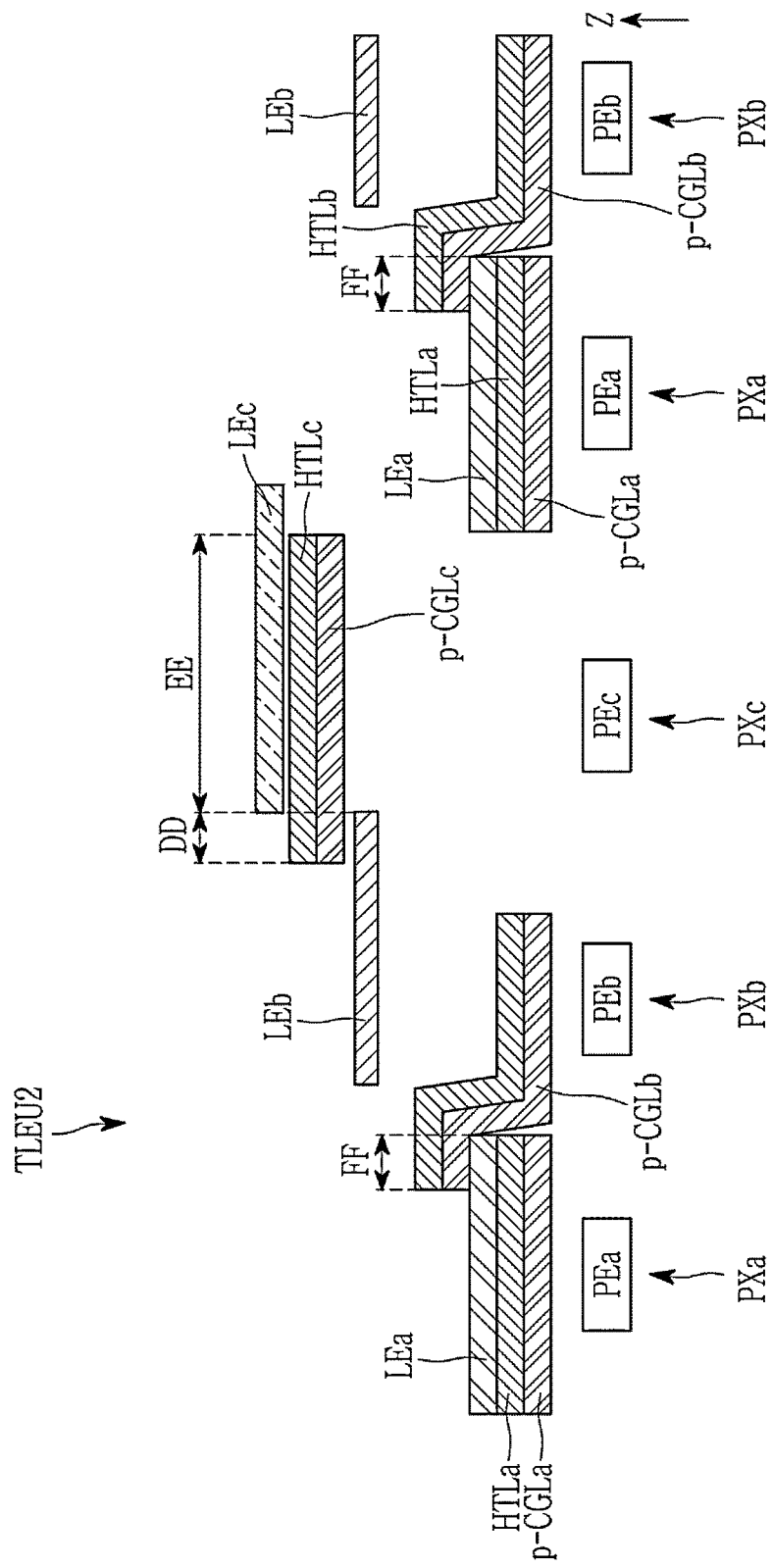
FIG. 13 shows the stacking order of the layers shown in FIG. 12.

Referring to FIG. 12 and FIG. 13, a display device according to an embodiment will be described.

FIG. 12 is a schematic cross-sectional view of some layers of a light emitting portion of pixels of a display device according to an embodiment, and FIG. 13 illustrates the stacking order of the layers shown in FIG. 12.

A display device of this embodiment may include a stacking structure of P-type charge generation layers p-CGLa, p-CGLb, and p-CGLc, hole transport layers HTLa, HTLb, and HTLc, and emission layers LEa, LEb, and LEc of a second sub-light emitting portion TLEU2.

P-type charge generation layers p-CGLa, p-CGLb, and p-CGLc, hole transport layers HTLa, HTLb, and HTLc, and emission layers LEa, LEb, and LEc of pixels PXa, PXb, and PXc may be continuously deposited.

For example, after a P-type charge generation layer p-CGLa, a hole transport layer HTLa, and an emission layer LEa of a first color pixel PXa are sequentially formed, a P-type charge generation layer p-CGLb, a hole transport layer HTLb, and an emission layer LEb of a second color pixel PXb may be sequentially formed, and then a P-type charge generation layer p-CGLc, a hole transport layer HTLc, and an emission layer LEc of a third color pixel PXc may be sequentially formed.

In this case, a pixel having a low driving voltage may be formed first, and a pixel having a high driving voltage may be formed later. In the embodiment shown in FIG. 12 and FIG. 13, among the driving voltages of the first, second, and third color pixels PXa, PXb, and PXc, the driving voltage of the third color pixel PXc formed last may be the highest, the driving voltage of the first color pixel PXa formed first may be the lowest, and the driving voltage of the second color pixel PXb formed in the middle may be between the driving voltages of the first and third color pixels PXa and PXc.

In the embodiment, a p-type charge generation layer of a pixel having a relatively high driving voltage may be formed later than an emission layer of a neighboring pixel having a relatively low driving voltage. Accordingly, an emission layer of a pixel with a relatively low driving voltage may have a relatively high driving voltage and may be positioned below a P-type charge generation layer of a neighboring pixel, and thus may emit no light.

The emission layers LEa and LEb of the first color pixel PXa and the second color pixel PXb having a relatively low driving voltage may be disposed below the P-type charge generation layer p-CGLc of the third color pixel PXc having a relatively high driving voltage. The emission layer LEa of the first color pixel PXa having a relatively low driving voltage may be positioned below the P-type charge generation layer p-CGLb of the second color pixel PXb having a relatively high driving voltage.

Therefore, although a part of the emission layer LEb of the second color pixel PXb overlaps the P-type charge generation layer p-CGLc of the third color pixel PXc in region DD due to an alignment error of a mask, no light is emitted from an emission layer LEb in region DD. In contrast, the emission layer LEc of the third color pixel PXc may normally emit light in region EE where the emission layer LEc overlaps the P-type charge generation layer p-CGLc. Although a part of the emission layer LEa of the first color pixel PXa overlaps the P-type charge generation layers p-CGLb and p-CGLc of the second color pixel PXb or the third color pixel PXc in region FF, no light is emitted from an emission layer LEa in region FF.

Accordingly, when a pixel of a color is driven, there is no leaky emission from neighboring pixels of other colors, and thus color mixing may be prevented and image quality may be improved.

The features of the embodiment described with reference to FIG. 9 are applicable to the embodiment of FIGS. 10 and 11 and the embodiment of FIG. 12 and FIG. 13.

It is to be understood that the embodiments are not limited to those of this disclosure. Instead, it is intended to cover various modifications and equivalent arrangements included within the spirit and scope of the appended claims.

What is claimed is:
1. A display device comprising:
a first pixel, a second pixel, and a third pixel that are adjacent to each other, wherein;
each of the first pixel, the second pixel, and the third pixel comprises:
a first electrode disposed on a substrate;
a first sub-light emitting portion disposed on the first electrode;
a second charge generation layer disposed on the first sub-light emitting portion;
a first charge generation layer disposed on the second charge generation layer;
a second sub-light emitting portion disposed on the first charge generation layer; and
a second electrode disposed on the second sub-light emitting portion,
the second sub-light emitting portion comprises:
a hole transport layer disposed on the first charge generation layer; and
an emission layer disposed on the hole transport layer, wherein
the hole transport layer of the first pixel is disposed on the first charge generation layer of the first pixel and completely covers the first charge generation layer of the first pixel,
the first charge generation layer of the second pixel has a first end, and a second end opposing the first end along a first direction,
the first end of the first charge generation layer of the second pixel overlaps an edge portion of the hole transport layer of the first pixel along a second direction perpendicular to an upper surface of the substrate,
the edge portion of the hole transport layer of the first pixel contacts a top surface of the second charge generation layer of the first pixel, and the first charge generation layer of the second pixel is spaced apart from the first charge generation layer of the third pixel.

2. The display device of claim 1, wherein a top surface of the edge portion of the hole transport layer of the first pixel contacts the first charge generation layer of the second pixel.

3. The display device of claim 1, wherein the second charge generation layer is disposed below the first charge generation layer.

4. The display device of claim 3, wherein the second charge generation layer of the first pixel, the second charge generation layer of the second pixel, and the second charge generation layer of the third pixel are connected to each other and are continuously formed over the substrate.

5. The display device of claim 1, wherein the first charge generation layer and the hole transport layer are aligned with each other in each of the first pixel, the second pixel, and the third pixel.

6. The display device of claim 1, wherein the first charge generation layer is a p-type charge generation layer, and the first charge generation layer comprises:
a material included in the hole transport layer; and
a p-type dopant.

7. A display device comprising:
a first pixel, a third pixel, and a second pixel that are adjacent to each other, wherein
each of the first pixel, the second pixel, and the third pixel comprises:
a first electrode disposed on a substrate;
a first sub-light emitting portion disposed on the first electrode;
a second charge generation layer disposed on the first sub-light emitting portion;
a first charge generation layer disposed on the second charge generation layer;
a second sub-light emitting portion disposed on the first charge generation layer; and
a second electrode disposed on the second sub-light emitting portion,
the second sub-light emitting portion comprises:
a hole transport layer disposed on the first charge generation layer; and
an emission layer disposed on the hole transport layer, wherein
the first charge generation layer of the third pixel has a first end, and a second end opposing the first end along the first direction,
an edge portion at the first end of the first charge generation layer of the third pixel is disposed above the emission layer of the first pixel and overlaps the emission layer of the first pixel along a second direction perpendicular to an upper surface of the substrate,
the edge portion of the hole transport layer of the third pixel contacts a top surface of the second charge generation layer of the third pixel, and
the first charge generation layer of the third pixel is spaced apart from the first charge generation layer of the second pixel.

8. The display device of claim 7, wherein an edge portion of the first charge generation layer of the second pixel is disposed on the hole transport layer of the first pixel adjacent to the second pixel and contacts the hole transport layer of the first pixel.

9. The display device of claim 7, wherein a part of an edge of the first charge generation layer of the second pixel is disposed on the emission layer of the first pixel and contacts the emission layer of the first pixel.

10. The display device of claim 7, wherein a driving voltage of the third pixel is higher than a driving voltage of the first pixel or a driving voltage of the second pixel.

11. The display device of claim 10, wherein the third pixel displays blue.

12. The display device of claim 7, wherein the hole transport layer of the first pixel is disposed on the first charge generation layer of the first pixel and completely covers the first charge generation layer of the first pixel.

13. The display device of claim 12, wherein a top surface of an edge portion of the hole transport layer of the first pixel contacts the first charge generation layer of the second pixel.

14. The display device of claim 12, wherein the edge portion of the hole transport layer of the first pixel contacts a top surface of a layer disposed below the first charge generation layer of the first pixel.

15. The display device of claim 7, wherein each of the first pixel, the second pixel, and the third pixel further comprises a second charge generation layer disposed below the first charge generation layer.

16. The display device of claim 15, wherein the second charge generation layer of the first pixel, the second charge generation layer of the second pixel, and the second charge generation layer of the third pixel are connected to each other and are continuously formed over the substrate.

17. The display device of claim 7, wherein the first charge generation layer and the hole transport layer are aligned with each other in each of the first pixel, the second pixel, and the third pixel.

* * * * *